US007773969B2

(12) United States Patent
Simon

(10) Patent No.: US 7,773,969 B2
(45) Date of Patent: Aug. 10, 2010

(54) CURRENT CONVERTER, FREQUENCY MIXER, RADIOFREQUENCY TRANSMISSION SYSTEM AND METHOD FOR FREQUENCY MIXING

(75) Inventor: Martin Simon, Otterfing (DE)

(73) Assignee: Infineon Technologies AG, Munich (DE)

( * ) Notice: Subject to any disclaimer, the term of this patent is extended or adjusted under 35 U.S.C. 154(b) by 503 days.

(21) Appl. No.: 11/857,826

(22) Filed: Sep. 19, 2007

(65) Prior Publication Data

US 2008/0070541 A1    Mar. 20, 2008

(30) Foreign Application Priority Data

Sep. 19, 2006    (DE) .................. 10 2006 043 902

(51) Int. Cl.
*H04B 1/26* (2006.01)
(52) U.S. Cl. ......................... 455/333; 327/359
(58) Field of Classification Search ................. 455/316, 455/317, 318, 323, 326, 330, 333; 327/113, 327/355, 357, 359; 330/253, 254
See application file for complete search history.

(56) References Cited

U.S. PATENT DOCUMENTS

| 4,931,746 | A  | * | 6/1990  | Trankle et al. ............... 330/254 |
| 5,642,071 | A  | * | 6/1997  | Sevenhans et al. .......... 327/359 |
| 6,054,889 | A  | * | 4/2000  | Kobayashi .................. 455/333 |
| 2003/0114129 | A1 | * | 6/2003  | Jerng ........................ 455/323 |
| 2003/0236083 | A1 |   | 12/2003 | Wiklund et al. |

FOREIGN PATENT DOCUMENTS

DE    43 36 668 A1    5/1994

* cited by examiner

*Primary Examiner*—Thanh C Le
(74) *Attorney, Agent, or Firm*—Eschweiler & Associates, LLC

(57) ABSTRACT

A current converter has a first amplification device, which outputs a differential current depending on a differential control signal and derives a differential feedback signal from the differential current. The current converter also has a second amplification device, which amplifies a differential input signal at its input depending on the differential feedback signal to form the differential control signal. The current converter may be used in a frequency mixer together with a mixer cell which produces a differential output signal by multiplying the differential current and an oscillator signal.

25 Claims, 3 Drawing Sheets

(PRIOR ART) FIG 5
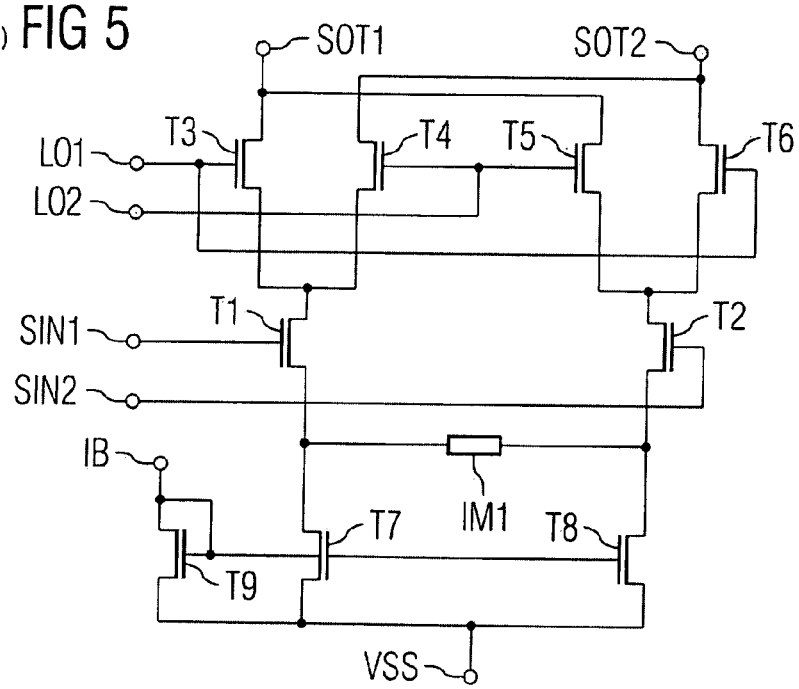
(PRIOR ART) FIG 6
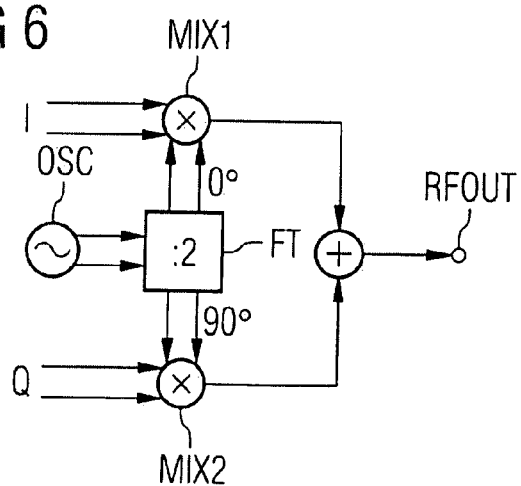
(PRIOR ART) FIG 7
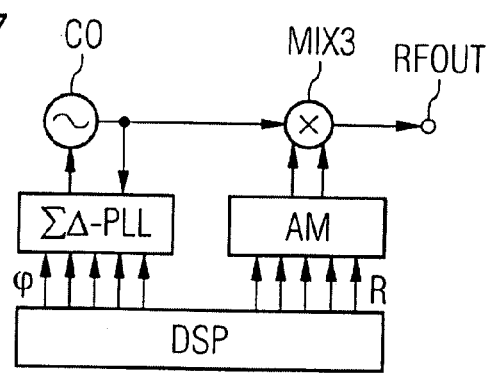

US 7,773,969 B2

CURRENT CONVERTER, FREQUENCY MIXER, RADIOFREQUENCY TRANSMISSION SYSTEM AND METHOD FOR FREQUENCY MIXING

REFERENCE TO RELATED APPLICATIONS

This application claims the benefit of the priority date of German application DE 10 2006 043 902.3, filed on Sep. 19, 2006, the contents of which are herein incorporated by reference in their entirety.

FIELD OF THE INVENTION

The invention relates to a current converter. The invention also relates to a frequency mixer having a current converter and to a radiofrequency transmission system. The invention furthermore relates to a method for frequency mixing.

BACKGROUND OF THE INVENTION

The demands on modern communication standards and on the signal quality of transmission devices are rising with the growing need for high data rates and increasing mobility. Mobile radio standards which have now become customary, such as Universal Mobile Telecommunications System (UMTS), Wideband Code Division Multiple Access (WCDMA), Global System for Mobile Communications (GSM), Enhanced Data Rates for GSM Evolution (EDGE), Wireless Local Area Network (WLAN) or Medium Rate Bluetooth, use bandwidth-efficient modulation types for transmitting high data rates both from a base station to a mobile appliance and from a mobile appliance to a base station. Examples of these modulation types are Quadrature Phase Shift Keying (QPSK), 8-Phase Shift Keying (8-PSK) or Quadrature Amplitude Modulation (QAM). With these types of modulation, what is known as a carrier signal has both its phase and its amplitude modulated in order to transmit the data.

In this context, a popular transmission device comprises a unit for baseband signal processing and a unit for radiofrequency signal processing. In this arrangement, the data for transmission are preprocessed in the baseband unit such that they can be modulated onto the carrier signal and amplified in the radiofrequency unit so as finally to be broadcast via an antenna. To modulate the data which is to be transmitted, what are known as mixers or frequency mixers are used.

FIG. 5 shows an exemplary embodiment of a conventional mixer operating on the basis of the double balanced principle. Such a mixer is also called a Gilbert mixer. The frequency mixer comprises two signal paths comprising transistors T1, T2 whose control connections form a signal input SIN1, SIN2 of the frequency mixer. The two signal paths are coupled to one another via a coupling impedance element IM1, which comprises an ohmic resistance, for example. The signal input SIN1, SIN2 can be used to supply a signal which comprises the data for transmission. In addition, a transistor T7 coupled to the transistor T1 and a transistor T8 coupled to the transistor T2 are provided which respectively form a current source, in the form of a current mirror, together with a transistor T9. A reference input IB coupled to the transistor T9 can be used to supply a reference current.

The frequency mixer also has two transistor pairs T3, T4 and T5, T6 whose control connections are coupled to an oscillator input LO1, LO2. The transistor pair T3, T4 has a first connection coupled to the transistor T1, while the transistor pair T5, T6 has a first connection coupled to the transistor T2. The transistors T3, T5 have a second signal connection connected to a first signal output connection SOT1. Similarly, second signal connections of the transistors T5, T6 are connected to a second signal output connection SOT2. The connections SOT1, SOT2 form a signal output of the frequency mixer.

In the frequency mixer shown, the signal input SIN1, SIN2 is used to supply data for mixing which control a current in the signal paths via the transistors T1, T2. The oscillator input LO1, LO2 is used to supply an oscillator signal, which is usually a radiofrequency square-wave signal. This alternately turns on the transistors T3 and T4 and T5 and T6, which routes the current through the transistors T1, T2 alternately to the signal output connections SOT1 and SOT2. At the signal output SOT1, SOT2, it is thus possible to tap off a mixed, differential output signal. On the basis of the principle illustrated, the input signal and the oscillator signal are multiplied.

Such mixers are used in a vector modulator, for example. FIG. 6 shows an exemplary embodiment of a conventional vector modulator. This comprises two frequency mixers MIX1, MIX2 which are supplied with data for transmission as vector data I, Q. In this arrangement, the data component I usually has a phase shift of 90° relative to the data component Q. The vector modulator also comprises an oscillator for producing an oscillator signal. This signal is supplied to a frequency divider which halves the frequency of the oscillator signal and at the same time derives two oscillator signals with a 90° shift relative to one another, which are output to the frequency mixers MIX1, MIX2. The output signals from the mixers MIX1, MIX2 are added and are provided at a common signal output RFOUT.

Frequency mixers may also be used in a polar modulator, as shown in FIG. 7, for example. In a polar modulator, the data for transmission are described as vectors with an amplitude component R and a phase component φ. In this exemplary embodiment, a signal processor DSP routes the phase component φ to a phase locked loop ΣΔ-PLL with a ΣΔ modulator which controls an oscillator CO. The oscillator CO may be a voltage controlled oscillator (VCO) or a digitally controlled oscillator (DCO). The oscillator produces a carrier signal which comprises the phase information for the phase component φ. The carrier signal is routed as an oscillator signal to a mixer MIX3 which is in the form of the Gilbert mixer shown in FIG. 5, for example.

The signal processor DSP also outputs the amplitude component R to an amplitude modulator AM whose output is coupled to the signal input of the mixer MIX3. The output of the mixer MIX3 is coupled to the signal output RFOUT for outputting the mixed radiofrequency signal.

With reference to FIG. 5, the mixers MIX1, MIX2, MIX3 in the exemplary embodiments shown in FIGS. 6 and 7 convert an input voltage at the signal input SIN1, SIN2 into a current via the transistors T1, T2 and the current sources formed by the transistors T7, T8, T9. The transistors T1, T2 are therefore a voltage/current converter. Since the transistors T1, T2 usually have a nonlinear characteristic, the voltage/current conversion produces nonlinear distortions in the input signal, for example in the form of harmonics.

When the converted current is actually mixed with the radiofrequency oscillator signal by means of the transistors T3, T4, T5, T6, the harmonics in the current signal may result in intermodulation products in the mixed radiofrequency signal. Particularly the third harmonic can widen the modulation spectrum and disturb the adjacent frequency channels. Hence, the signal quality of the mixed signal can be impaired, which is manifested by an increased bit error rate or an impaired error vector magnitude (EVM), for example.

In the exemplary embodiment shown in FIG. 5 for a frequency mixer, the distortions can be reduced by resistive negative feedback, the provision of a large operating current and lowering of the amplitude at the input of the frequency mixer, for example. However, the resistive negative feedback increases the thermal noise in the frequency mixer, while the gain falls. A larger operating current in the frequency mixer usually increases shot noise in a bipolar transistor or channel noise in a field effect transistor on account of the necessary increase in the size of the transistor channel. Lowering the input amplitude in turn regularly results in impairment of the efficiency of the frequency mixer.

This is problematical particularly because the thermal noise in the frequency mixer can dominate the overall noise in a transmitter.

BRIEF SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

In one exemplary embodiment, a current converter comprises a differential signal input, a differential current output and a first and a second differential amplifier. The first differential amplifier has a first current path comprising a first transistor and a second current path comprising a second transistor. In the case of the first and second transistors, control connections form a differential input of the first differential amplifier. The first and second transistors have respective first connections, which are coupled to the differential current output, and respective second connections, which are coupled to one another via a coupling impedance element.

In one embodiment the second differential amplifier has an output which is coupled to the differential input of the first differential amplifier. In addition, the second differential amplifier has a first and a second input which are coupled to the differential signal input of the current converter. Furthermore, the first input is coupled to the second connection of the second transistor via a first impedance element and the second input is coupled to the second connection of the first transistor via a second impedance element. The first and second impedance elements advantageously have at least one ohmic component.

In one embodiment, current conversion is effected by actuating the first and second transistors with the output signals from the second differential amplifier. Resistance-based or impedance-based feedback of signals on the first and second transistors to the inputs of the second differential amplifier linearizes the current conversion, that is to say that a differential output current at the differential current output of the current converter is linearly dependent on a differential input signal at the differential signal input. Harmonics in the differential output current are therefore reduced.

In other embodiments, the first differential amplifier may comprise a current source which is coupled to the transistors and which is formed by a current mirror, for example. In addition, the second differential amplifier may be formed by an operational amplifier. The differential input signal may be supplied as a differential voltage via impedance elements at the first and second inputs of the second differential amplifier. In this arrangement, the impedance elements may be switchable and designed to have an adjustable impedance value.

One illustrative embodiment of a frequency mixer comprises not only a current converter in accordance with one of the embodiments described, but also a mixer cell which has a differential current input which is coupled to the differential current output of the current converter. In addition, the mixer cell has a differential oscillator input for supplying an oscillator signal and a differential signal output for outputting a mixed output signal. The mixer cell may be in the form of a double balanced mixer, in one embodiment.

The use of a current converter with reduced harmonics in the differential output current in one embodiment of the frequency mixer allows frequency mixing to be achieved in which intermodulation products in the mixed radiofrequency output signal are reduced in comparison with a conventional frequency mixer.

In another embodiment of the frequency mixer, a second or further mixer cell may be provided which has its current input connected to the differential current output of the current converter. By way of example, the further mixer cell is designed for a different frequency band than the first mixer cell. In this case, the mixer cells are supplied with oscillator signals at different oscillator frequencies. The use of a common current converter for a plurality of mixer cells allows the space requirement on the chip to be reduced when integrating the frequency mixer in an integrated circuit.

In another embodiment of the invention, a frequency mixer comprises a first amplification device which outputs a differential current depending on a differential control signal and derives a differential feedback signal from the differential current. In addition, a second amplification device is provided which amplifies a differential input signal at its input depending on the differential feedback signal to form the differential control signal. The frequency mixer also comprises a mixer cell which produces a differential output signal by multiplying the differential current and an oscillator signal.

In one embodiment, producing the feedback signal in the first amplification device and supplying the feedback signal to the second amplification device allows linearization of a differential current in the first amplification device with respect to the differential input signal. This in turn results in reduced intermodulation products in the differential output signal from the mixer cell.

In another embodiment, a differential input signal is amplified depending on a differential feedback signal to form a differential control signal. A differential current is controlled depending on the differential control signal and a differential feedback signal is derived from the differential current. The differential current is mixed with an oscillator signal. The mixing can be done by means of double balanced mixing, in one embodiment.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in more detail below using a plurality of exemplary embodiments with reference to the drawings in which:

FIG. 5 shows a conventional frequency mixer, FIG. 6 shows a vector modulator, and FIG. 7 shows a polar modulator.

DETAILED DESCRIPTION OF THE INVENTION

Figure 1:
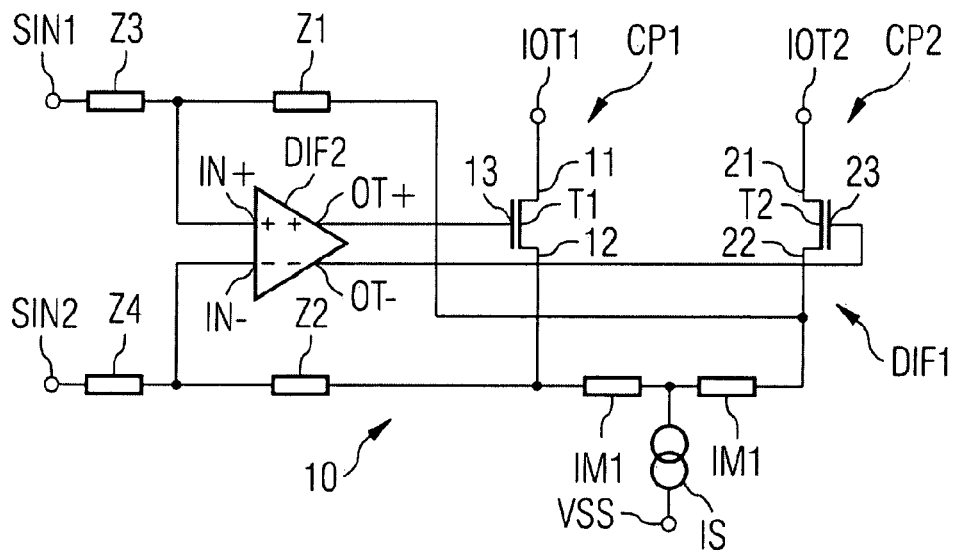
FIG. 1 shows one embodiment of a current converter according to the invention.

In the following description further aspects and embodiments of the present invention are disclosed. In addition, reference is made to the accompanying drawings, which form a part hereof, and in which is shown by way of illustration, in which the invention may be practiced. The embodiments of the drawings present a disclosure in order to provide a better understanding of one or more aspects of the present invention. This disclosure is not intended to limit the features or key-elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made without departing from the scope of the present invention. The elements of the drawing are not necessarily to scale relative to each other. Like reference numerals designate corresponding similar parts.

FIG. 1 shows one embodiment of a current converter 10. The current converter 10 comprises a first differential amplifier DIF1 having a first transistor T1, a second transistor T2 and a current source IS. The first transistor T1 is arranged in a current path CP1 between a reference potential connection VSS and a first connection IOT1 of a differential current output IOT1, IOT2 which also comprises the current source IS. Similarly, the transistor T2 is arranged in a second current path CP2 between a second connection IOT2 of the differential current output IOT1, IOT2 and the reference potential connection VSS. In this arrangement, first connections 11, 21 of the first and second transistors T1, T2 are connected to the differential current output IOT1, IOT2. Second connections 12, 22 of the transistors T1, T2 are coupled to one another via coupling impedance elements IM1, which usually have the same impedance value. A connecting node of the coupling impedance elements IM1 is a mid-potential connection to which the current source IS is connected in this case.

The current converter 10 also comprises a second differential amplifier DIF2, which has a differential signal input with a first input connection IN+ and a second input connection IN−. The first input IN+ is coupled to the second connection 22 of the second transistor T2 via a first impedance element Z1 and to a connection SIN1 via a further impedance element Z3. The second connection IN− of the second differential amplifier DIF2 is connected to the second connection 12 of the transistor T1 via a second impedance element Z2. In addition, the connection IN− is coupled to a second input connection SIN2 via a further impedance element Z4. The connections SIN1, SIN2 form a differential signal input of the current converter 10.

Control connections 13, 23 of the first and second transistors T1, T2 form a differential input of the first differential amplifier DIF1 and are coupled to output connections OT+, OT− of the second differential amplifier DIF2.

In the embodiment of FIG. 1, the second differential amplifier DIF2 is formed by an operational amplifier. In this embodiment the differential amplifiers DIF1, DIF2 each perform the function of an amplification device. Each of the first and the second differential amplifiers DIF1, DIF2 comprises a separate current source which are independent of each other. Therefore the differential amplifiers DIF1, DIF2 can be operated independently.

In one embodiment, the first and second transistors T1, T2 are in the form of n-channel field effect transistors. In an alternative embodiment, the transistors T1, T2 may also be in the form of bipolar transistors.

The differential signal input SIN1, SIN2 is used to supply a differential input signal, which may be a voltage signal, to the inputs IN+, IN− of the second differential amplifier DIF2. The differential input signal is amplified to form a differential control signal, which is output at the outputs OT+, OT− of the second differential amplifier DIF2. The control signal for the second differential amplifier DIF2 controls a differential current in the first and second current paths CP1, CP2 via the transistors T1, T2.

The impedance elements Z1, Z2 take the respective currents in the first and second current paths CP1, CP2 and derive a feedback signal which is routed to the inputs IN+, IN− of the second differential amplifier DIF2. This involves negative feedback, since the current in the first transistor T1, which is actuated via the first connection OT+, which is a noninverting output of the second differential amplifier DIF2, is fed back to the second input IN−, which is an inverting input of the second differential amplifier DIF2. Similarly, the current in the second transistor T2, which is actuated via the second output OT−, which is an inverting output, is fed back to the noninverting input IN+ of the second differential amplifier DIF2. By way of example, the impedance elements Z1, Z2, Z3, Z4 may be in the form of complex resistances with a purely or predominantly ohmic component.

The feedback actuation of the transistors T1, T2 can improve the linearity response of the transistors T1, T2. This is because the transistors T1, T2 are actuated such that a current flowing through them is linearly dependent on the differential input signal by virtue of a ratio of the impedance values of the impedance elements Z1, Z2, Z3, Z4. In other words, the feedback makes it possible to ensure a linear dependency for a differential output current at the differential current output IOT1, IOT2 on a differential input signal at the signal input SIN1, SIN2. Using the proposed principle, it is possible to reduce not only odd-numbered harmonics but also even-numbered harmonics in the output current.

By virtue of a suitable choice of impedance values for the impedance elements Z1, Z2, Z3, Z4, it is possible to set a gain factor for amplifying the differential input signal into the differential output current. If the differential input signal is supposed to be supplied as an impressed current signal, the input impedance elements Z3, Z4 may even be omitted. In this embodiment, the current converter 10 is a linearized current/current converter.

In one embodiment, the impedance elements Z1, Z2, Z3, Z4 may also be in the form of complex resistances with a capacitive or inductive component. In this embodiment, the impedance elements Z1, Z2, Z3, Z4 have filter properties for filtering the differential input signal or the differential current, for example in line with low pass filtering.

The differential output current from the current converter 10 is also influenced by the coupling impedance elements IM1. In one embodiment, the coupling impedance elements IM1 may be formed by ohmic resistances. In this case, there is no frequency-based influencing of the differential output current. In another embodiment, the coupling impedance elements IM1 may have an inductive or capacitive component. Hence, with a suitable choice of impedance value for the coupling impedance elements IM1, it is possible to achieve filter properties for the coupling impedance elements IM1 and for the differential current to be filtered, for example in line with low pass filtering.

Figure 2:
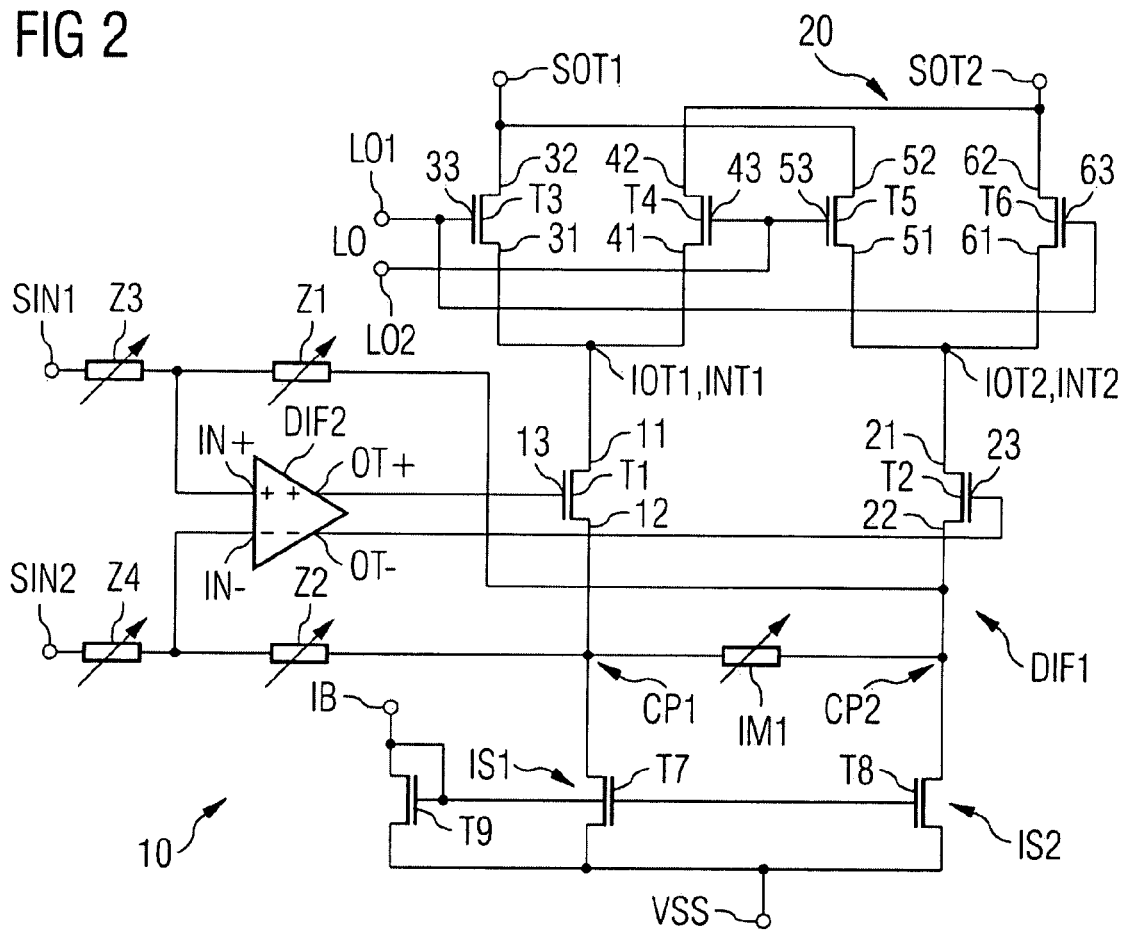
FIG. 2 shows one embodiment of a frequency mixer according to the invention.

FIG. 2 shows an embodiment of a frequency mixer having a current converter 10 and a mixer cell 20. The design and operation of the current converter 10 essentially correspond to those of the embodiment shown in FIG. 1. The second connections 12, 22 of the first and second transistors T1, T2 are coupled via a coupling impedance element IM1, which may again have resistive, capacitive or inductive properties.

In addition, two current sources IS1, IS2 are provided. The first current source IS1, which is in the form of a current mirror comprising a transistor T7 and a transistor T9, is connected to the second connection 12 of the first transistor T1. Accordingly, the second current source IS2, which is in the form of a current mirror comprising the transistor T9 and a transistor T8, is connected to the second connection 22 of the second transistor T2. A reference current is supplied to the transistor T9 via a reference connection IB.

The mixer cell 20 comprises a third, a fourth, a fifth and a sixth transistor T3, T4, T5, T6 having a control connection 33, 43, 53, 63 and a first signal connection 31, 41, 51, 61 and also a second signal connection 32, 42, 52, 62, respectively. In this case, the control connections 33, 63 of the third and sixth transistors T3, T6 are coupled to a first connection LO1 of an oscillator input LO1, LO2, and control connections 43, 53 of the fourth and fifth transistors T4, T5 are coupled to a second connection LO2 of the oscillator input LO1, LO2.

The mixer cell 20 has a differential current input INT1, INT2 which is coupled to the differential current output IOT1, IOT2 of the current converter 10. In addition, the mixer cell 20 comprises a differential oscillator input LO1, LO2 for supplying an oscillator signal LO and a differential signal output SOT1, SOT2 for outputting a mixed output signal.

The first signal connections 31, 41 of the third and fourth transistors T3, T4 are coupled to a first connection INT1 and the first signal connections 51, 61 of the fifth and sixth transistors T5, T6 are coupled to a second connection INT2 of the current input INT1, INT2. The second signal connections 32, 52 of the third and fifth transistors T3, T5 are connected to a first connection SOT1 and the second signal connections 42, 62 of the fourth and sixth transistors T4, T6 are connected to a second connection SOT2 of the signal output SOT1, SOT2.

As described previously for FIG. 1, the current converter 10 performs a linear conversion of a differential input voltage at the signal input SIN1, SIN2 into a differential output current at the current output IOT1, IOT2, which in this embodiment simultaneously forms the differential current input INT1, INT2 of the mixer cell 20. In this embodiment, the impedance elements Z1, Z2, Z3, Z4 and the coupling impedance element IM1 are in the form of switchable or otherwise variable resistances.

Figure 3:
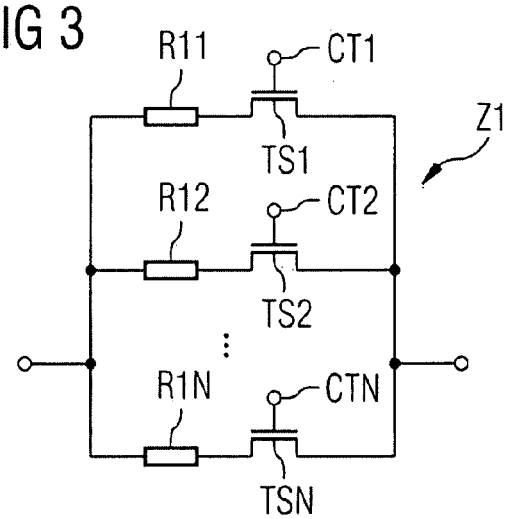
FIG. 3 shows one embodiment of a switchable resistance according to the invention.

FIG. 3 shows one embodiment of a switchable resistance which can be inserted into the current converter 10 in FIG. 2. In this case, the resistance Z1 comprises a plurality of parallel-connected series circuits which each comprise a resistor R1, R12, R1N and an associated switching transistor TS1, TS2, TSN. The transistors TS1, TS2, TSN are used as switches in one embodiment in order to activate or deactivate the resistors R11, R12, R1N. This can be done by means of appropriate control signals on the control inputs CT1, CT2, CTN of the transistors TS1, TS2, TSN. The resistance values of the resistors R11, R12, R1N may be the same or may have a binary or other type weighting relative to one another. Accordingly, a resistance value for the switchable resistance Z1 can be set by means of appropriate control signals.

With reference to FIG. 2, by setting the resistance values for the impedance elements Z1, Z2, Z3, Z4 and for the coupling impedance element IM1 it is possible to set the gain factor of the current converter 10. In other words, the amplification in the current converter 10 is produced using an adjustable gain factor in one embodiment. In this case, the amplification does not have a negative influence on the linearity of the current converter 10 on account of the unchanged linear properties of the impedance elements Z1, Z2, Z3, Z4 and of the coupling impedance element IM1.

The differential output current from the current converter 10 is supplied to the mixer cell 20 comprising the transistors T3, T4, T5, T6, which are also referred to as a mixer quartet. The transistors T3, T4, T5, T6 are actuated by means of the oscillator signal, which is usually in square-wave form, which multiplies the differential current and the oscillator signal. In this context, it is again also possible to refer to double balanced mixing. Since the harmonics are suppressed in the differential current by the current converter, intermodulation products in the mixed output signal at the signal output SOT1, SOT2 will end up being small. Since the controlled differential current in the current converter 10 is supplied directly to the mixer quartet T3, T4, T5, T6 in the mixer cell 20, the power consumption is increased only insignificantly in comparison with the conventional frequency mixer, depending on the currents in the second differential amplifier DIF2.

In one embodiment the frequency mixer may be used in a radiofrequency transmission system. By way of example, the mixer is used in a transmission/reception device for a WLAN system. This involves the application of Orthogonal Frequency Division Multiplexing (OFDM) modulation, for example 64-QAM-OFDM modulation. The modulator used may be a vector modulator, as is shown in FIG. 6, for example. In contrast to a vector modulator with a conventional mixer, in the case of a vector modulator with a linearized mixer based on one of the embodiments described, the power consumption of the transmitter may be halved or the output power may be increased.

A frequency mixer according to one of the embodiments described may also be used in a polar modulator, as is shown in FIG. 7, for example. In this case too, the use of a linearized frequency mixer can reduce the power consumption of the modulator arrangement in comparison with conventional embodiments. Besides WLAN systems, the proposed embodiments can also be applied to frequency mixers for other transmission systems and standards, such as UMTS or GSM/EDGE.

Figure 4:
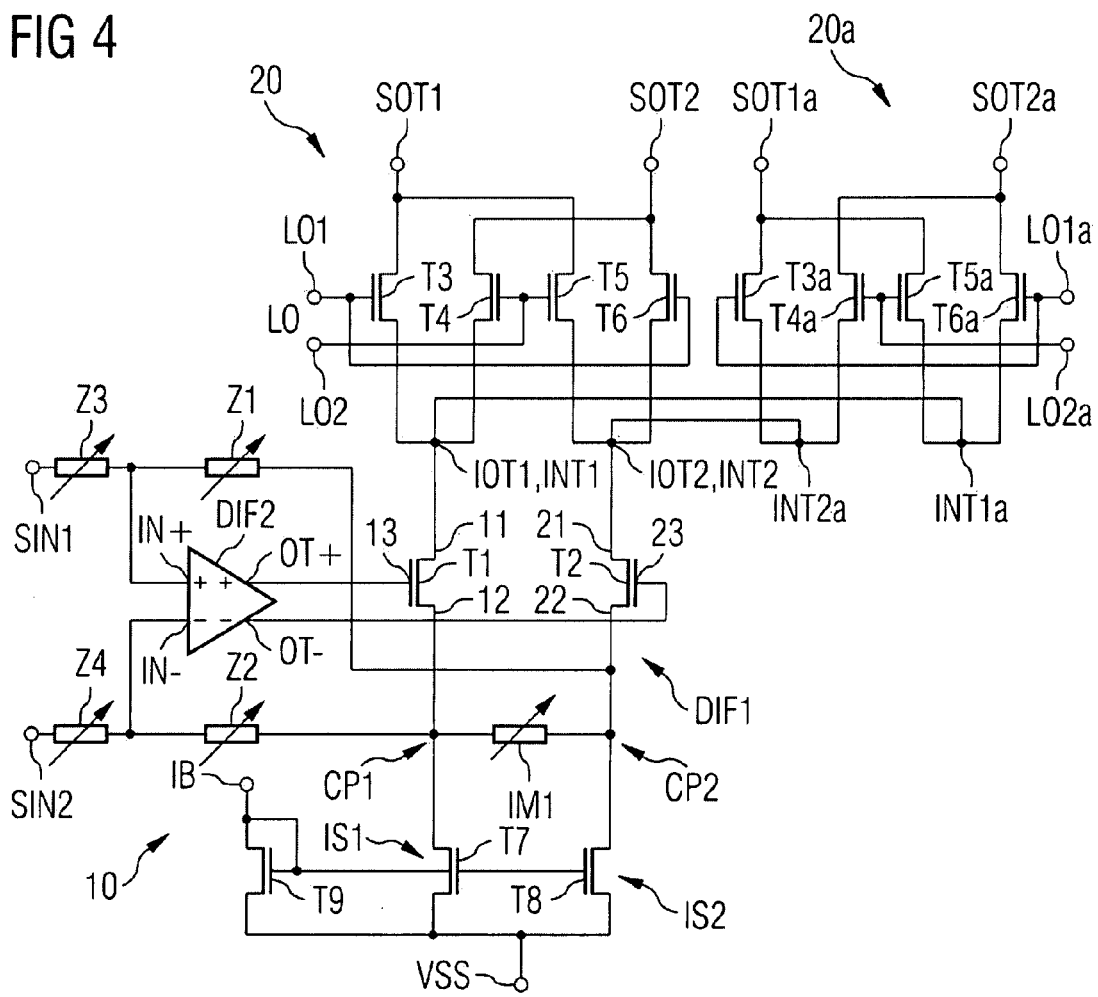
FIG. 4 shows another embodiment of a frequency mixer according to the invention.

FIG. 4 shows another embodiment of a frequency mixer. As an extension to the embodiment shown in FIG. 2, the frequency mixer comprises a further, second mixer cell 20a, which has a design generally corresponding to that of the first mixer cell 20. The further mixer cell 20a thus comprises a further mixer quartet with the transistors T3a, T4a, T5a, T6a, whose control connections are coupled to a further differential oscillator input LO1a, LO2a. In addition, the further mixer cell 20a has a further differential current input INT1a, INT2a, which is coupled to the differential current output IOT1, IOT2 of the current converter 10. A mixed output signal can be output at a further differential signal output SOT1a, SOT2a.

In one embodiment, the first mixer cell 20 and the further mixer cell 20a are designed for different frequency bands, that is to say for different frequencies of an oscillator signal. By way of example, in one embodiment the first mixer cell 20 is designed for a frequency of approximately 2.4 GHz, while the further mixer cell 20a is designed for a frequency of approximately 5 GHz. However, the production of an input signal for modulation which is supplied to the current converter 10 may be identical for both resultant frequency ranges. The input signal can accordingly be converted by means of the current converter 10 into a differential current which, by way of example, is supplied either to the first mixer cell 20 or to the further mixer cell 20a, or both, in order to obtain an output signal mixed with the respective oscillator signal.

In one embodiment the first mixer cell 20 is supplied with an oscillator signal at a first oscillator frequency. To deactivate the second mixer cell 20a, it is possible to apply to the further oscillator input LO1a, LO2a, for example, a signal which puts the transistors T3a, T4a, T5a, T6a into an off state, for example a ground signal. This prevents a flow of current through the transistors T3a, T4a, T5a, T6a in the further mixer cell 20a, and mixing is performed only by means of the first mixer cell 20.

Accordingly, for modulation with an oscillator signal at a second oscillator frequency, this oscillator signal can be supplied to the further oscillator input LO1a, LO2a, while the oscillator input LO1, LO2 of the first mixer cell 20 is supplied with a ground signal. In this case, modulation is effected only by means of the further mixer cell 20a. A flow of current through the first mixer cell 20 is prevented by the transistors T3, T4, T5, T6, which are off.

With the embodiment shown in FIG. 4, it is possible to save the space for a further current converter when the frequency mixer is integrated in an integrated circuit, resulting in a reduction in manufacturing costs. The proposed principle is particularly suitable for using radio systems using linear modulation methods.

Even though use in a transmission device is assumed in the embodiments shown, with the frequency of the oscillator signal being higher than a signal frequency of the differential input signal, the proposed embodiments may also be used in a down-conversion mixer in a reception system. In the case of a down-conversion mixer, the frequency of the oscillator signal is usually less than or equal to the frequency of the input signal.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. A current converter, comprising:
a differential signal input;
a differential current output;
a first differential amplifier, having a first current path comprising a first transistor and a second current path comprising a second transistor, wherein control connections of the first and second transistors form a differential input of the first differential amplifier, and wherein respective first connections of the first and second transistors are coupled to the differential current output, and respective second connections of the first and second transistors are coupled together via a coupling impedance element;
a second differential amplifier, having a differential output coupled to the differential input of the first differential amplifier, and a first and second input coupled to the differential signal input, wherein the first input is coupled to the second connection of the second transistor of the first differential amplifier via a first impedance element and the second input is coupled to the second connection of the first transistor of the first differential amplifier via a second impedance element.

2. The current converter of claim 1, wherein the first differential amplifier further comprises at least one current source coupled to the second connections of the first and second transistors.

3. The current converter of claim 2, wherein the at least one current source comprises a current mirror.

4. The current converter of claim 1, wherein the coupling impedance element or the first and second impedance elements, or both, have filter properties.

5. The current converter of claim 1, wherein the second differential amplifier comprises an operational amplifier.

6. The current converter of claim 1, wherein the first and second transistors comprise n-channel field effect transistors.

7. The current converter of claim 1, wherein the coupling impedance element or the first and second impedance elements, or both, comprise switchable resistances.

8. The current converter of claim 1, wherein the first and second inputs of the second differential amplifier are coupled to the differential signal input via a third and a fourth impedance element, respectively.

9. The current converter of claim 8, wherein the third and fourth impedance elements comprise switchable resistances or have filter properties, or both.

10. A frequency mixer, comprising:
a current converter, comprising a differential signal input, a differential current output, and a first and a second differential amplifier; and
a mixer cell, comprising a differential current input, coupled to the differential current output of the current converter, a differential oscillator input configured to receive an oscillator signal, and a differential signal output configured to output a mixed output signal;
wherein the first differential amplifier comprises a first current path comprising a first transistor and a second current path comprising a second transistor;
wherein control connections of the first and second transistors form a differential input of the first differential amplifier, respective first connections of the first and second transistors are coupled to the differential current output, and respective second connections of the first and second transistors are coupled together via a coupling impedance element;
wherein the second differential amplifier comprises a differential output coupled to the differential input of the first differential amplifier, and a first and a second input which are coupled to the differential signal input; and wherein the first input of the second differential amplifier is coupled to the second connection of the second transistor of the first differential amplifier via a first impedance element, and the second input of the second differential amplifier is coupled to the second connection of the first transistor of the first differential amplifier via a second impedance element.

11. The frequency mixer of claim 10, wherein the mixer cell comprises a double balanced mixer.

12. The frequency mixer of claim 10, wherein:
the mixer cell comprises a third, a fourth, a fifth and a sixth transistor, each having a control connection and a first and a second signal connection, respectively;
the control connections of the third and sixth transistors are coupled to a first connection of the oscillator input;
the control connections of the fourth and fifth transistors are coupled to a second connection of the oscillator input;
the first signal connections of the third and fourth transistors are coupled to a first connection of the current input;
the first signal connections of the fifth and sixth transistors are coupled to a second connection of the current input;
the second signal connections of the third and fifth transistors are coupled to a first connection of the signal output; and
the second signal connections of the fourth and sixth transistors are coupled to a second connection of the signal output.

13. The frequency mixer of claim 10, further comprising a further mixer cell, the further mixer cell comprising a further differential current input, which is coupled to the differential current output of the current converter, a further differential oscillator input configured to receive a further oscillator signal and a further differential signal output configured to output a further mixed output signal.

14. A frequency mixer, comprising:
a first amplification device configured to output a differential current based on a differential control signal and derive a differential feedback signal from the differential current;
a second amplification device configured to amplify a differential input signal at its input based on the differential feedback signal to form the differential control signal; and
a mixer cell configured to produce a differential output signal by multiplying the differential current and an oscillator signal.

15. The frequency mixer of claim 14, wherein the second amplification device is supplied with the differential feedback signal via a first impedance element pair.

16. The frequency mixer of claim 14, wherein the mixer cell comprises a double balanced mixer.

17. The frequency mixer of claim 14, wherein the first amplification device is configured to filter the differential current.

18. The frequency mixer of claim 14, wherein the second amplification device is supplied with the differential input signal via a second impedance element pair.

19. A radiofrequency transmission system having a frequency mixer, the frequency mixer comprising:
a first amplification device configured to output a differential current based on a differential control signal and derive a differential feedback signal from the differential current;
a second amplification device configured to amplify a differential input signal at its input based on the differential feedback signal to form the differential control signal; and
a mixer cell configured to produce a differential output signal by multiplying the differential current and an oscillator signal.

20. A method for frequency mixing, comprising:
amplifying a differential input signal to form a differential control signal based on a differential feedback signal associated with a first amplification device, the differential input signal amplified by a second amplification device;
controlling a differential current based on the differential control signal using the first amplification device;
deriving the differential feedback signal from the differential current using the first amplification device; and
mixing the differential current with an oscillator signal.

21. The method of claim 20, wherein the differential feedback signal is fed back through a resistive impedance.

22. The method of claim 20, wherein the amplifying is effected with an adjustable gain factor.

23. The method of claim 20, wherein the differential input signal comprises a differential input voltage.

24. The method of claim 20, wherein the mixing is performed using double balanced mixing.

25. The method of claim 20, wherein the differential current is filtered.

* * * * *